(12) United States Patent
Nishiwaki et al.

(10) Patent No.: US 9,514,958 B2
(45) Date of Patent: Dec. 6, 2016

(54) ETCHING METHOD OF SEMICONDUCTOR SUBSTRATE, AND METHOD OF PRODUCING SEMICONDUCTOR DEVICE

(71) Applicant: FUJIFILM Corporation, Tokyo (JP)

(72) Inventors: Yoshinori Nishiwaki, Shizuoka (JP); Tetsuya Kamimura, Shizuoka (JP); Tadashi Inaba, Shizuoka (JP); Atsushi Mizutani, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/722,811

(22) Filed: May 27, 2015

(65) Prior Publication Data

US 2015/0255309 A1 Sep. 10, 2015

Related U.S. Application Data

(63) Continuation of application No. PCT/JP2013/081762, filed on Nov. 26, 2013.

(30) Foreign Application Priority Data

Nov. 28, 2012 (JP) ................. 2012-259788

(51) Int. Cl.
*H01L 21/302* (2006.01)
*H01L 21/3213* (2006.01)
*C09K 13/00* (2006.01)
(Continued)

(52) U.S. Cl.
CPC ......... *H01L 21/32134* (2013.01); *C09K 13/00* (2013.01); *H01L 21/02063* (2013.01); *H01L 21/0332* (2013.01); *H01L 21/32139* (2013.01); *H01L 21/31144* (2013.01)

(58) Field of Classification Search
CPC . H01L 21/311; H01L 21/31144; C09K 8/08; C09K 13/08
USPC .......................... 438/694, 754; 216/37, 67; 252/79.1–79.4
See application file for complete search history.

(56) References Cited

U.S. PATENT DOCUMENTS 6,150,250 A 11/2000 Tabara et al.
6,806,034 B1 * 10/2004 Guggemos ............... C23F 1/02
430/311

(Continued)

FOREIGN PATENT DOCUMENTS

CN 101126053 A 2/2008
CN 101246317 A 8/2008
(Continued)

OTHER PUBLICATIONS

International Search Report of PCT/JP2013/081762 dated Jan. 7, 2014 [PCT/ISA/210].
(Continued)

*Primary Examiner* — Duy Deo
*Assistant Examiner* — Maki Angadi
(74) *Attorney, Agent, or Firm* — Sughrue Mion, PLLC

(57) ABSTRACT

An etching method containing the step of processing a substrate having a first layer containing titanium nitride (TiN) and a second layer containing a transition metal by bringing an etching liquid into contact with the substrate and thereby removing the first layer, wherein the first layer has a surface oxygen content from 0.1 to 10% by mole, and wherein the etching liquid comprises an ammonia compound and an oxidizing agent, and has a pH of from 7 to 14.

47 Claims, 2 Drawing Sheets

(51) Int. Cl.
*H01L 21/033* (2006.01)
*H01L 21/02* (2006.01)
*H01L 21/311* (2006.01)

(56) References Cited

U.S. PATENT DOCUMENTS

| | | |
|---|---|---|
| 7,105,458 B1 | 9/2006 | Tai |
| 7,691,701 B1 | 4/2010 | Belyansky et al. |
| 2006/0234502 A1* | 10/2006 | Bhat ............... H01L 21/28088 438/656 |
| 2009/0017626 A1* | 1/2009 | Park ..................... C09K 13/08 438/694 |
| 2009/0017636 A1* | 1/2009 | Kumazawa ....... H01L 21/32134 438/745 |
| 2009/0212021 A1* | 8/2009 | Bernhard ................. C23F 1/28 216/109 |
| 2013/0296215 A1 | 11/2013 | Rao et al. |

FOREIGN PATENT DOCUMENTS

| | | |
|---|---|---|
| CN | 202394978 U | 8/2012 |
| CN | 103151314 A | 6/2013 |
| JP | 07-281445 A | 10/1995 |
| JP | 11-145144 A | 5/1999 |
| JP | 2001-257191 A | 9/2001 |
| JP | 2005-097715 A | 4/2005 |
| JP | 2007-067367 A | 3/2007 |
| JP | 2008-547202 A | 12/2008 |
| JP | 2009-021516 A | 1/2009 |
| JP | 2010-010273 A | 1/2010 |
| JP | 2012-514854 A | 6/2012 |
| WO | 2012/048079 A2 | 4/2012 |

OTHER PUBLICATIONS

Office Action issued on Sep. 1, 2016 in corresponding Chinese Patent Application No. 201380057885.2.

* cited by examiner

ETCHING METHOD OF SEMICONDUCTOR SUBSTRATE, AND METHOD OF PRODUCING SEMICONDUCTOR DEVICE

CROSS-REFERENCE TO RELATED APPLICATIONS

This application is a continuation of PCT/JP2013/081762 filed on Nov. 26, 2013 which claims benefit of Japanese Patent Application No. 2012-259788 filed on Nov. 28, 2012, the subject matter of which is incorporated herein by reference in their entirety.

TECHNICAL FIELD

The present invention relates to an etching method of a semiconductor substrate and a method of producing a semiconductor device.

BACKGROUND ART

Miniaturization and diversification of semiconductor devices have progressed more and more, and a processing method thereof covers a wide range with respect to each of device structures and production steps. As regards etching of the substrate, development of both dry etching and wet etching has been advanced, and a variety of chemical liquids and processing conditions have been proposed depending on kinds and structures of the substrate material.

Above all, when a high-integrated device structure is produced, a technique of etching a prescribed material precisely is important and as one of techniques of addressing such problem, a wet etching which utilizes a chemical liquid is exemplified. For example, a precise etching processing is required in the production of circuit wiring of a microscopic transistor circuit, a metal electrode material, or a substrate having a barrier layer, a hard mask, and the like. However, sufficient study has not yet been done on etching conditions and chemical liquids suitable for each of the substrates containing a wide variety of metal compounds. Under these circumstances, efficient removal of a hard mask or the like applied to the device substrate has been laid out as a production problem. Specifically, as regards titanium nitride (TiN) which is applied as a metal hard mask, there are several examples of studies on chemical liquids for etching this material (see Patent Literatures 1 to 6).

CITATION LIST

Patent Literatures

Patent Literature 1: JP-A-2001-257191 ("JP-A" means unexamined published Japanese patent application)
Patent Literature 2: WO 2012/048079
Patent Literature 3: JP-A-2009-021516
Patent Literature 4: JP-T-2008-547202 ("JP-T" means published Japanese translation of PCT application)
Patent Literature 5: JP-A-2005-097715
Patent Literature 6: JP-A-2007-067367

SUMMARY OF INVENTION

Technical Problem

The above Patent Literatures 1 and 2 disclose an etching liquid in which an ammonia compound and hydrogen peroxide are mixed. According to confirmation by the present inventors, however, they have come to see that a surface of the TiN-containing layer after etching becomes non-uniform by simply using the etching liquid having the above-described formula, thereby causing a partial residue after etching (etching unevenness). In view of the exacting request level by the present-day semiconductor industries, improvement in such non-uniformity of the substrate surface has been desired. Further, achievement of uniformization after etching of a metal surface provided together has also been required at the same time.

In view of the above, the present invention addresses the provision of an etching method which, in etching a first layer containing titanium nitride (TiN), can achieve uniformization after etching of the above TiN-containing layer and metal layer, an etching liquid used in the method, and a method of producing a semiconductor device using the same.

Solution to Problem

The above problems can be solved by the following means.

[1] An etching method comprising the step of:
processing a substrate having a first layer containing titanium nitride (TiN) and a second layer containing a transition metal by bringing an etching liquid into contact with the substrate and thereby removing the first layer,
wherein the first layer has a surface oxygen content from 0.1 to 10% by mole,
wherein the etching liquid comprises an ammonia compound and an oxidizing agent, and has a pH of from 7 to 14.
[2] The etching method described in the item [1], wherein the transition metal is selected from Co, Ni, Cu, Ag, Ta, Hf, W, Pt and Au.
[3] The etching method described in the item [1] or [2], wherein the ammonia compound is ammonia or a salt thereof.
[4] The etching method described in any one of the items [1] to [3], wherein the above-described oxidizing agent is a nitric acid or a hydrogen peroxide.
[5] The etching method described in any one of the items [1] to [4], wherein an etching rate (R1) of the first layer is 200 Å/min or greater and less than 1000 Å/min.
[6] The etching method described in any one of the items [1] to [5], wherein the etching liquid further contains at least one surface uniformizing agent selected from the group consisting of a nitrogen-containing organic compound, an aromatic compound and an oxygen-containing organic compound.
[7] The etching method described in the item [6], wherein the surface uniformizing agent includes a compound represented by any one of the following formulae (I) to (IX):

-continued

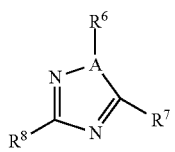 (III)

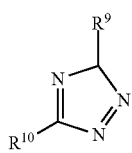 (IV)

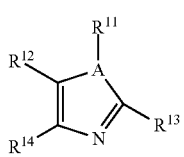 (V)

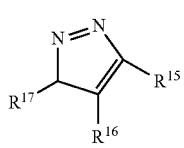 (VI)

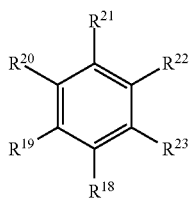 (VII)

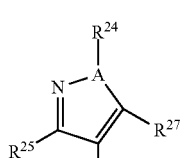 (VIII)

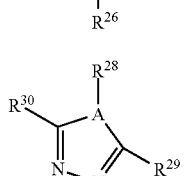 (IX)

wherein, $R^1$ to $R^{30}$ each independently represent a hydrogen atom or a substituent; in this case, neighbors adjacent to each other may be linked or ring-fused to form a cyclic structure; A represents a hetero atom with the proviso that when A is divalent, there exists none of $R^1$, $R^3$, $R^6$, $R^{11}$, $R^{24}$ and $R^{28}$ by which A is each substituted.

[8] The etching method described in the item [7], wherein the surface uniformizing agent includes a compound selected from the following groups.

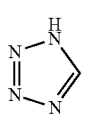 I-1

-continued

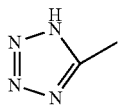 I-2

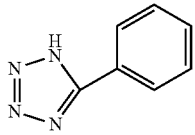 I-3

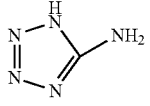 I-4

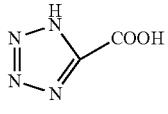 I-5

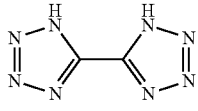 I-6

 III-1

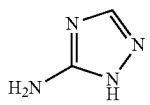 III-2

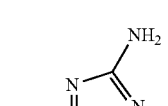 III-3

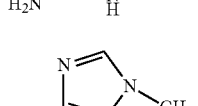 III-4

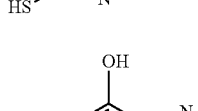 III-5

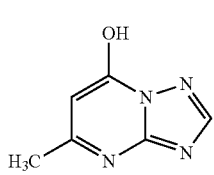 IV-1

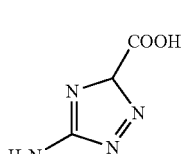 II-1

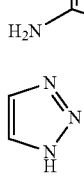

-continued

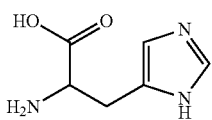

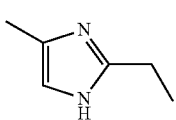

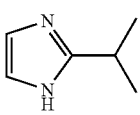

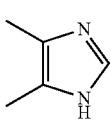

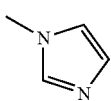

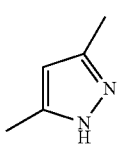

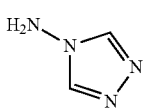

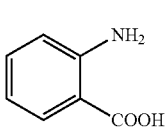

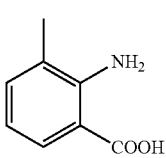

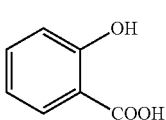

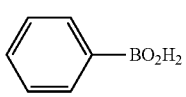

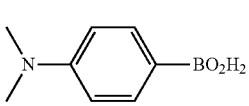

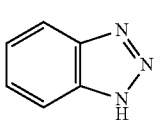

V-1

V-2

V-3

V-4

V-5

VIII-1

IX-1

VII-1-1

VII-1-2

VII-1-3

VII-1-4

VII-1-5

VII-2-1

-continued

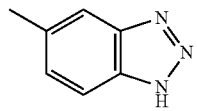

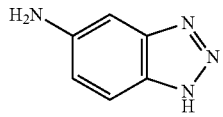

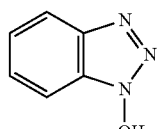

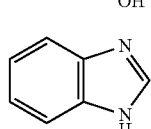

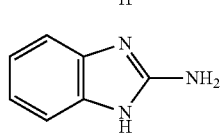

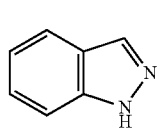

VII-2-2

VII-2-3

VII-2-4

VII-3-1

VII-3-2

VII-4-1

[9] The etching method described in the item [6], wherein the surface uniformizing agent is at least one selected from the group consisting of an alcohol compound solvent having 2 to 15 carbon atoms and an ether compound solvent having 2 to 15 carbon atoms.

[10] The etching method described in any one of the items [6] to [9], wherein the surface uniformizing agent is contained in a range of from 0.01 to 10% by mass.

[11] The etching method described in any one of the items [1] to [10], wherein the ammonia compound is contained in a range of from 0.1 to 15% by mass.

[12] The etching method described in any one of the items [1] to [11], wherein the oxidizing agent is contained in a range of from 0.5 to 50% by mass.

[13] The etching method described in any one of the items [1] to [12], comprising the steps:

mixing a first liquid containing the ammonia compound and a second liquid containing the oxidizing agent to prepare the etching liquid; and then on a timely basis, bringing the etching liquid into contact with the substrate thereby processing it.

[14] The etching method described in any one of the items [1] to [13], wherein a thickness of the first layer is from 0.005 to 0.3 μm.

[15] The etching method described in any one of the items [1] to [14], wherein a width of the second layer is 2 nm or more and less than 1000 nm.

[16] An etching liquid that processes a substrate having a first layer containing titanium nitride (TiN) and a second layer containing a transition metal, and that is applied by selecting the substrate in which a surface oxygen content of the first layer is from 0.1 to 10% by mole, wherein the etching liquid is an etching liquid having a pH of from 7 to 14, that contains an ammonia compound and an oxidizing agent.

[17] The etching liquid described in the item [16], wherein the ammonia compound is contained in a range of from 0.1 to 15% by mass.
[18] The etching liquid described in the item [16] or [17], wherein the oxidizing agent is contained in a range of from 0.5 to 50% by mass.
[19] The etching liquid described in any one of the items [16] to [18], further containing at least one surface uniformizing agent selected from the group consisting of a nitrogen-containing organic compound, an aromatic compound and an oxygen-containing organic compound.
[20] A kit for preparing an etching liquid, comprising a first liquid containing an ammonia compound and a second liquid containing an oxidizing agent in combination, wherein the kit is composed of the etching liquid having a pH of from 7 to 14, that processes a substrate having a first layer containing titanium nitride (TiN) and a second layer containing a transition metal, and etching liquid is applied by selecting a substrate in which a surface oxygen content of the first layer is from 0.1 to 10% by mole.
[21] The kit for preparing an etching liquid described in the item [20], wherein at least one surface uniformizing agent selected from the group consisting of a nitrogen-containing organic compound, an aromatic compound and an oxygen-containing organic compound is further contained in at least one of the first liquid and the second liquid, or a third liquid other than the first liquid and the second liquid.
[22] A method of producing a semiconductor device comprising the steps:
removing a first layer containing titanium nitride (TiN) by the etching method described in any one of the items [1] to [15]; and
producing the semiconductor device from the remaining substrate.

Advantageous Effects of Invention

According to the method of the present invention, at the time of etching a first layer containing titanium nitride (TiN), surface uniformization after etching of the metal layer (second layer) can also be achieved together with surface uniformization (suppression of etching unevenness) after etching of the first TiN layer.

Other and further features and advantages of the invention will appear more fully from the following description, appropriately referring to the accompanying drawings.

DESCRIPTION OF EMBODIMENTS

Figure 1:
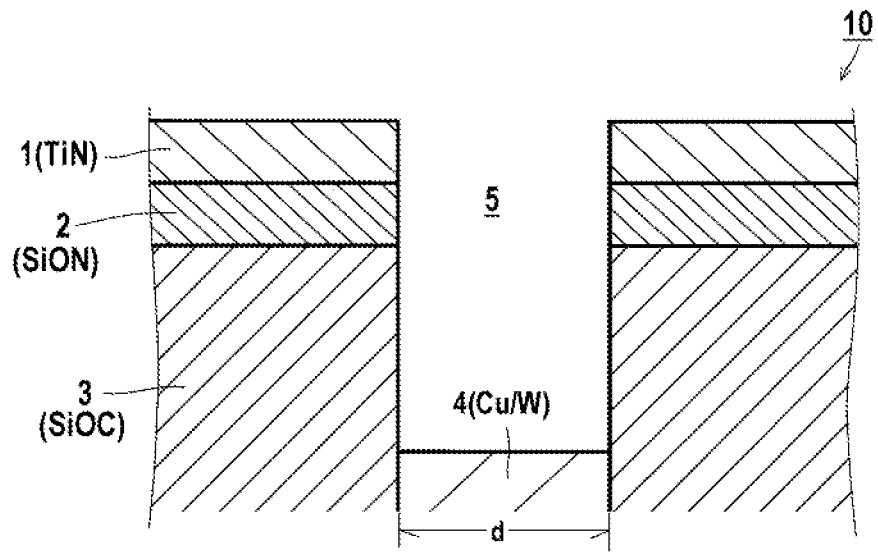
FIG. 1 is a section view diagrammatically showing an example of a production step of a semiconductor substrate (before etching) according to one embodiment of the present invention.
Figure 2:
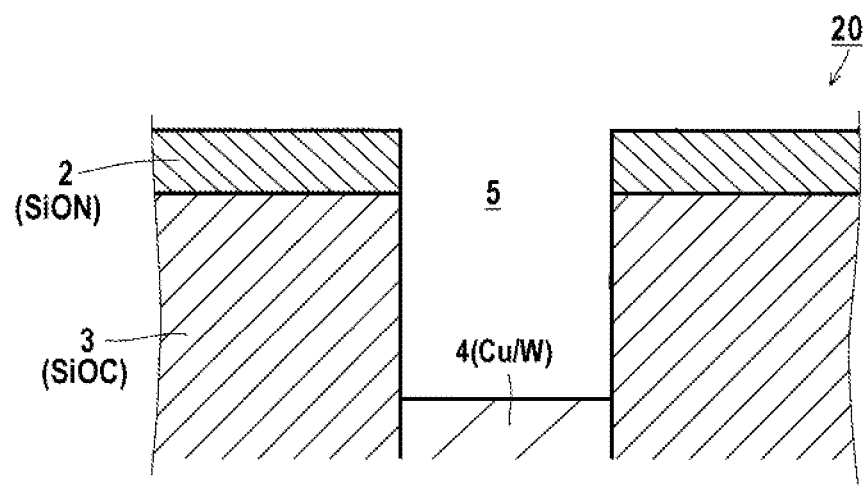
FIG. 2 is a section view diagrammatically showing an example of a production step of a semiconductor substrate (after etching) according to one embodiment of the present invention.

First, preferable embodiments of the etching step concerning the etching method of the present invention are explained on the basis of FIG. 1 and FIG. 2.

[Etching Process]

FIG. 1 is a view showing a semiconductor substrate before etching. In the production example of the present embodiment, a layered product is used, in which SiOC layer 3 and SiON layer 2 as a specific third layer are disposed on a silicon wafer (not shown) and the first layer (TiN layer) 1 is formed on the third layer. At this time, via 5 has been formed already in the above-described composite layer and, a second layer (metal layer) 4 containing a metal has been formed at the bottom of via 5. Onto substrate 10 at this state, an etching liquid (not shown) according to the present embodiment is brought into contact to remove the TiN layer. As a result, substrate 20 having a configuration in which the TiN film has been removed as shown in FIG. 2 can be obtained. Needless to say, although the etching as graphically shown is ideal in the present invention and a preferable embodiment thereof, a remainder of the TiN layer or alternatively some corrosion of the second layer is appropriately acceptable according to a required quality of a semiconductor device to be produced and the like and, therefore, the present invention is not construed to a limited extent by the above description.

Note that, when a silicon substrate or a semiconductor substrate, or simply a substrate is mentioned, these are used in the sense of including not only a silicon wafer but also a whole substrate structure provided with a circuit structure. The term "the element of the substrate" refers to an element that constitutes the silicon substrate that is defined above, and may be made of a single material or a plurality of materials. A processed semiconductor substrate is sometimes called as a semiconductor substrate product by a distinction. A tip or a processed product thereof, which has been obtained by further processing the semiconductor substrate, if needed, and then by singulating the same is referred to as semiconductor device or semiconductor equipment. With respect to the direction of the semiconductor, in reference to FIG. 1, the opposite side to the silicon wafer (TiN side) is called as "upper", or "head edge", while the silicon wafer side (SiOC side) is called as "under", or "bottom".

[Etching Liquid]

Next, a preferable embodiment of the etching liquid of the present invention is explained. The etching liquid of the present embodiment contains an oxidizing agent and an ammonia compound. Hereinafter, each of components including optional ones is explained.

(Oxidizing Agent)

Examples of the oxidizing agent include nitric acid, hydrogen peroxide, ammonium persulfate, perboric acid, peracetic acid, periodic acid, perchloric acid, or a combination thereof. Among them, nitric acid or hydrogen peroxide is particularly preferable.

The oxidizing agent is preferably contained in an amount of 0.5% by mass or more, more preferably in an amount of 1% by mass or more, and particularly preferably in an amount of 5% by mass or more, with respect to the total amount of the etching liquid of the present embodiment. The upper limit thereof is less than 50% by mass, preferably 40% by mass or less, still more preferably 30% by mass or less. By setting to the above upper limit or less, excess etching of the second layer can preferably be suppressed to a higher level. Setting to the above lower limit or more is preferable from the viewpoint of etching the first layer in a sufficient rate. Further, by adjusting this amount to the preferable range, uniformization on an etching surface of the first layer can preferably be achieved more effectively.

As the above-described oxidizing agent, one kind thereof may be used solely, or two or more kinds thereof may be used in combination.

(Ammonia Compound)

The ammonia compound means a compound which forms an ammonium ion ($NH_4^+$) in an aqueous medium and is defined as compounds including ammonia and its salts. Specifically, $NH_4OH$ is preferable. As for the rest, $NH_4Cl$, $NH_4ClO_4$, $NH_4F$, $NH_4Br$, $NH_4CH_3COO$, $(NH_4)_2SO_4$, $NH_4NO_3$, $(NH_4)_2CO_3$, and the like may also be used.

The ammonia compound is preferably incorporated in an amount of 0.1% by mass or more, more preferably incorporated in an amount of 0.5% by mass or more, and particularly preferably incorporated in an amount of 1% by mass or more, with respect to the total mass of the etching liquid according to the present embodiment. The upper limit thereof is preferably 15% by mass or less, more preferably 12% by mass or less, and particularly preferably 10% by mass or less. By setting to the above-described upper limit or less, change in the composition due to evaporation can be suppressed and consequently variation in the performance can preferably be suppressed. By setting to the above-described lower limit or more, a stable etching rate of TiN can preferably be obtained.

In relation to the oxidizing agent, the ammonia compound is preferably used in an amount of 1 part by mass or more, and more preferably in an amount of 10 parts by mass or more, with respect to 100 parts by mass of the oxidizing agent. The upper limit thereof is preferably 100 parts by mass or less, more preferably 70 parts by mass or less, and particularly preferably 50 parts by mass or less. By using the amounts of both compounds in a suitable relation, a good etching performance can be realized and also high in-plane uniformity can be achieved together.

As the above-described ammonia compound, one kind thereof may be used solely, or two or more kinds thereof may be used in combination.

(Surface Uniformizing Agent)

It is preferable for the etching liquid of the present invention to contain a surface uniformizing agent that improves surface uniformity after etching of the metal layer. By coupling with achievement of surface uniformity (suppression of etching unevenness) of the above first layer (TiN layer), increase in surface uniformity of the metal layer provided together (second layer) makes it possible to contribute greatly to the improvement in production process and the advance in production quality, in comparison with the counterpart having uniformity solely.

Nitrogen-Containing Organic Compound/Aromatic Compound

The surface uniformizing agent is preferably a nitrogen-containing organic compound. In particular, a 5- or 6-membered nitrogen-containing heterocyclic compound (the hetero atom is a nitrogen atom, an oxygen atom, a sulfur atom and the like) is preferable. Alternatively, as a preferable surface uniformizing agent, an aromatic compound is exemplified. The heterocyclic compound and the aromatic compound may be monocyclic or polycyclic. Above all, a 5-membered nitrogen-containing heteroaromatic compound is more preferable. The number of nitrogen to be contained at this time is preferably from 1 to 4. As the aromatic compound, a compound having a benzene ring is preferable.

The surface uniformizing agent is preferably a compound represented by any one of the following formulae (I) to (IX).

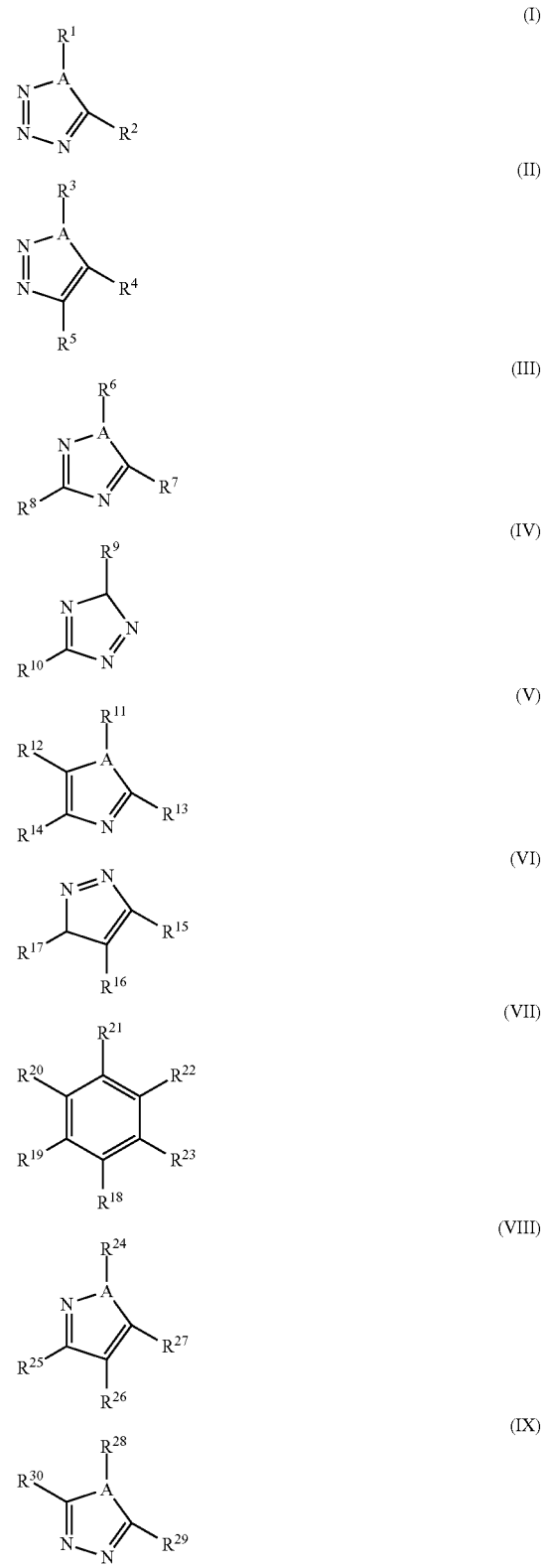

$R^1$ to $R^{30}$

In formulae (I) to (IX), $R^1$ to $R^{30}$ each independently represent a hydrogen atom or a substituent. Examples of the substituent include an alkyl group (having preferably 1 to 20 carbon atoms, more preferably 1 to 6 carbon atoms)

described below, an alkenyl group (having preferably 2 to 20 carbon atoms, more preferably 2 to 6), an aryl group (having preferably 6 to 24 carbon atoms, more preferably 6 to 12 carbon atoms), a heterocyclic group (having preferably 1 to 20 carbon atoms, more preferably 1 to 6 carbon atoms), an alkoxy group (having preferably 1 to 20 carbon atoms, more preferably 1 to 6), an acyl group (having preferably 2 to 20 carbon atoms, more preferably 2 to 6 carbon atoms), an amino group (having preferably 0 to 6 carbon atoms), a carboxyl group, a phosphoric acid group, a hydroxy group, a thiol group (—SH), and a boronic acid group (—B(OH)$_2$). Note that, as the aryl group, a phenyl group or a naphthyl group is preferred. The above-described heterocyclic group includes a nitrogen-containing heteroaromatic group. Above all, a 5-membered nitrogen-containing heteroaromatic group is preferred and a pyrrole group, an imidazole group, a pyrazole group, a triazole group, or a tetrazole group is more preferred. Furthermore, these substituents may have a substituent within the scope in which the effect of the present invention is exerted. Note that, among the above-described substituents, an amino group, a carboxyl group, a phosphoric acid group, and a boronic acid group may form their salts. Examples of the counter ion that forms a salt include quaternary ammonium ions such as ammonium ion (NH$_4^+$) and tetramethyl ammonium ion ((CH$_3$)$_4$N$^+$).

The above-described substituent may be substituted through an arbitrary linking group. The linking group includes an alkylene group (the number of carbon atoms is preferably 1 to 20, more preferably 1 to 6), an alkenylene group (the number of carbon atoms is preferably 2 to 20, more preferably 2 to 6), an ether group (—O—), an imino group (the number of carbon atoms is preferably 0 to 4), a thioether group (—S—), a carbonyl group, or a combination thereof. Hereinafter, these linking groups are called "linking group L". Furthermore, these linking groups may have a substituent within the scope in which the effect of the present invention is exerted.

As $R^1$ to $R^{30}$, above all, an alkyl group having 1 to 6 carbon atoms, a carboxyl group, an amino group (the number of carbon atoms is preferably 0 to 4), a hydroxyl group, or a boronic acid group is preferred. As described above, these substituents may be substituted through the linking group L.

Further, as for $R^1$ to $R^{30}$, neighbors adjacent to each other may be linked or ring-fused to form a cyclic structure. Examples of the ring structure to be formed include a pyrrole ring structure, an imidazole ring structure, a pyrazole ring structure, or a triazole ring structure. Furthermore, these ring-structural sites may have a substituent within the scope in which the effect of the present invention is exerted. Note that, when the ring structure to be formed is a benzene ring, this ring structure is sectionalized into formula (VII) to organize it.

A

A represents a hetero atom, specifically a nitrogen atom, an oxygen atom, a sulfur atom, or a phosphorous atom. However, when A is divalent (an oxygen atom, or a sulfur atom,), there exists none of $R^1$, $R^3$, $R^6$, $R^{11}$, $R^{24}$ and $R^{28}$.

The compound represented by the above-described formula (VII) is preferably a compound represented by any one of the following formulae (VII-1) to (VII-4).

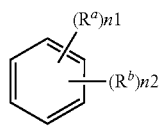

(VII-1)

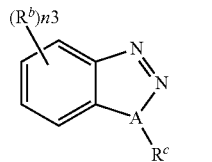

(VII-2)

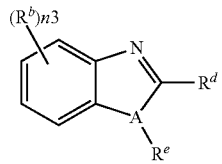

(VII-3)

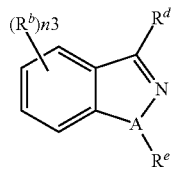

(VII-4)

$R^a$ represents an acid group, preferably a carboxyl group, a phosphoric acid group, or a boronic acid group. The above-described acid group may be substituted through the above-described linking group L.

$R^b$ represents an alkyl group having 1 to 6 carbon atoms, an amino group (preferably 0 to 4 carbon atoms), a hydroxyl group, an alkoxy group (preferably 1 to 6 carbon atoms), or an acyl group (preferably 1 to 6 carbon atoms). The above-described substituent $R^b$ may be substituted through the above-described linking group L. When a plurality of $R^b$'s are present, these may be linked or ring-fused to form a ring structure.

n1 is an integer of 1 to 5. n2 is an integer of 0 to 5. n3 is an integer of 0 to 4.

When each of n1 to n3 is 2 or more, a plurality of substituents defined there may be the same or different from one another.

In the formulae, A has the same definitions as A defined above. $R^c$, $R^d$ and $R^e$ are the same groups as the defined groups for $R^1$ to $R^{30}$. However, when A is divalent, there exists none of $R^c$ and $R^e$.

Hereinafter, examples of the compounds represented by any one of the above-described formulae (I) to (IX) are shown. However, the present invention is not construed as being limited on the basis of these compounds.

Note that, in the following exemplified compounds, the case of showing an example of a tautomer thereof is included. The other tautomer is also included in preferable examples of the present invention. The same is also true on the above-described formulae (I) to (IX) and (VII-1) to (VII-4).

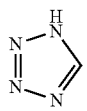

I-1

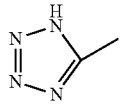

I-2

-continued
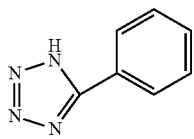
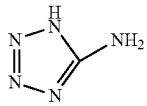
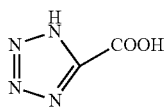
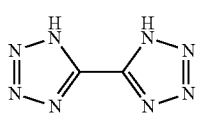
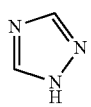
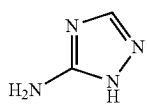
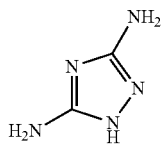
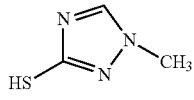
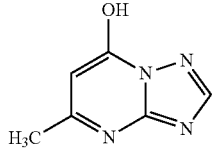
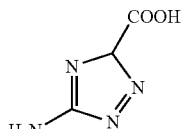
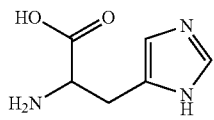
-continued
I-3 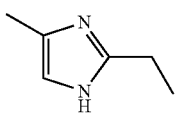
I-4 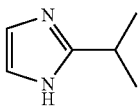
I-5 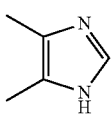
I-6 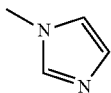
III-1 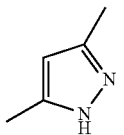
III-2 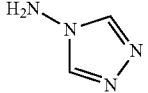
III-3 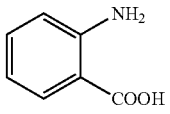
III-4 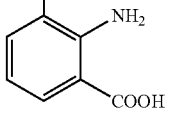
III-5 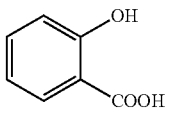
IV-1 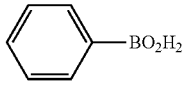
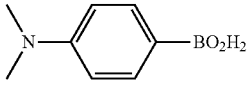
II-1 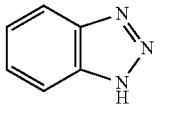
V-1 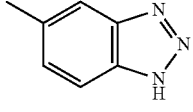
V-2
V-3
V-4
V-5
VIII-1
IX-1
VII-1-1
VII-1-2
VII-1-3
VII-1-4
VII-1-5
VII-2-1
VII-2-2

VII-2-3
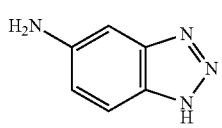

VII-2-4
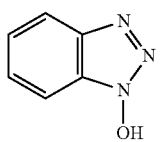

VII-3-1
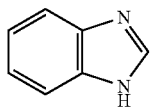

VII-3-2
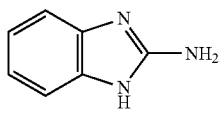

VII-4-1
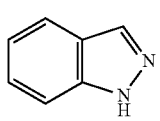

The content of the nitrogen-containing organic compound or the aromatic compound that constitutes the surface uniformizing agent, although it is not limited in particular, is preferably 0.01% by mass or more, more preferably 0.05% by mass or more, and particularly preferably 0.1% by mass or more, in the etching liquid. The upper limit, although it is not limited in particular, is preferably 10% by mass or less, more preferably 5% by mass or less, still more preferably 3% by mass or less, and particularly preferably 1% by mass or less. By setting to the above lower limit or more, a suitable uniformization effect for the metal layer can preferably be obtained. On the other hand, setting to the above-described upper limit or less is preferable from the viewpoint that it does not interfere with a good etching performance.

Oxygen-Containing Organic Compound

It is also preferable that the etching liquid according to the present invention contains an oxygen-containing organic compound as the above-described surface uniformizing agent. The oxygen-containing organic compound is preferably a compound that acts as a water-soluble organic solvent. The water-soluble organic solvent is preferably an organic solvent that is miscible with water in an arbitrary proportion.

Examples of the oxygen-containing organic compound include: alcohol compound solvents such as methyl alcohol, ethyl alcohol, 1-propyl alcohol, 2-propyl alcohol, 2-butanol, ethylene glycol, propylene glycol, glycerin, 1,6-hexanediol, cyclohexanediol, sorbitol, xylitol, 2-methyl-2,4-pentanediol, 1,3-butanediol, and 1,4-butanediol; and ether compound solvents including alkylene glycol alkyl ethers (ethylene glycol monomethyl ether, ethylene glycol monobutyl ether, diethylene glycol, dipropylene glycol, propylene glycol monomethyl ether, diethylene glycol monomethyl ether, triethylene glycol, polyethylene glycol, propylene glycol monomethyl ether, dipropylene glycol monomethyl ether, tripropylene glycol monomethyl ether, diethylene glycol monobutyl ether, and the like).

Above all, alcohol compound solvents having 2 to 15 carbon atoms and hydroxyl group-containing ether compound solvents having 2 to 15 carbon atoms are preferable, and more preferably hydroxyl group-containing alcohol compound solvents having 2 to 10 carbon atoms and hydroxyl group-containing ether compound solvents having 2 to 10 carbon atoms. In particular, alkylene glycol alkyl ethers having 3 to 8 carbon atoms are preferable. The oxygen-containing organic compound may be used solely or in an adequate combination of two or more kinds Note that, in the present specification, the compound having both a hydroxyl group (—OH) and an ether group (—O—) in the molecule shall be basically included in the ether compound (it is not called an alcohol compound), and when the compound having both the hydroxyl group and the ether group is referred to by a distinction in particular, sometimes it may be called a hydroxyl group-containing ether compound.

The above-described oxygen-containing organic compound is preferably a compound represented by the following formula (O-1).

$$R^{11}-(-O-R^{13}-)_n-O-R^{12} \quad (O\text{-}1)$$

$R^{11}, R^{12}$ $R^{11}$ and $R^{12}$ are each independently a hydrogen atom or an alkyl group having 1 or more and 5 or less carbon atoms. Among these, they are each independently preferably an alkyl group having 1 or more and 5 or less carbon atoms, and more preferably an alkyl group having 1 or more and 3 or less carbon atoms.

$R^{13}$ $R^{13}$ is a straight-chain or branched-chain alkylene chain having 1 or more and 4 or less carbon atoms. When a plurality of $R^{13}$'s are present, they may be different from one another.

n n is an integer of 1 or more and 6 or less.

The addition amount of the oxygen-containing organic compound is preferably from 0.1 to 70% by mass and more preferably from 10 to 50% by mass, with respect to the total mass of the etching liquid. By setting the addition amount to the above-described lower limit or greater, improvement in uniformity of the above-described etching can be effectively realized.

As the above-described surface uniformizing agent, one kind thereof may be used solely, or two or more kinds thereof may be used in combination.
よい。

It is noted that in the present specification, the representation of the compound (for example, when the name of a chemical is called by putting the term "compound" at the foot of the chemical name) is used in the sense that not only the compound itself, but also its salt, and its ion are incorporated therein. Further, it is used in the sense that the compound means to include a derivative thereof which is modified in a predetermined part, such as introduction of a substituent, within a range of achieving a desired effect.

In the present specification, a substituent (a linking group is also the same) that is not specified by substitution or non-substitution means that the substituent may have an optional substituent. This is applied to the compound that is not specified by substitution or non-substitution. Preferable examples of the substituent include the substituent T described below.

The substituent T includes the following substituents.

The substituents include an alkyl group (preferably an alkyl group having 1 to 20 carbon atom(s), for example, methyl, ethyl, isopropyl, t-butyl, pentyl, heptyl, 1-ethylpentyl, benzyl, 2-ethoxyethyl, and 1-carboxymethyl), an alkenyl group (preferably an alkenyl group having 2 to 20 carbon atoms, for example, vinyl, allyl, and oleyl), an alkynyl group (preferably an alkynyl group having 2 to 20 carbon atoms, for example, ethynyl, butadiynyl, and phenylethynyl), a cycloalkyl group (preferably a cycloalkyl group having 3 to 20 carbon atoms, for example, cyclopropyl, cyclopentyl, cyclohexyl, and 4-methylcyclohexyl), an aryl group (preferably an aryl group having 6 to 26 carbon atoms, for example, phenyl, 1-naphthyl, 4-methoxyphenyl, 2-chlorophenyl, and 3-methylphenyl), a heterocyclic group (preferably a heterocyclic group having 2 to 20 carbon atoms, more preferably a 5- or 6-membered heterocyclic group having at least one hetero atom selected from oxygen, sulfur and nitrogen atoms, for example, 2-pyridyl, 4-pyridyl, 2-imidazolyl, 2-benzimidazolyl, 2-thiazolyl, and 2-oxazolyl), an alkoxy group (preferably an alkoxy group having 1 to 20 carbon atom(s), for example, methoxy, ethoxy, isopropyloxy, and benzyloxy), an aryloxy group (preferably an aryloxy group having 6 to 26 carbon atoms, for example, phenoxy, 1-naphthyloxy, 3-methylphenoxy, and 4-methoxyphenoxy), an alkoxycarbonyl group (preferably an alkoxycarbonyl group having 2 to 20 carbon atoms, for example, ethoxycarbonyl and 2-ethylhexyloxycarbonyl), an amino group (preferably an amino group, an alkylamino group or an aryl amino group having 0 to 20 carbon atom(s), for example, amino, N,N-dimethylamino, N,N-diethylamino, N-ethylamino, and anilino), a sulfamoyl group (preferably a sulfamoyl group having 0 to 20 carbon atom(s), for example, N,N-dimethylsulfamoyl, and N-phenylsulfamoyl), an acyl group (preferably an acyl group having 1 to 20 carbon atom(s), for example, acetyl, propionyl, butyryl and benzoyl), an acyloxy group (preferably an acyloxy group having 1 to 20 carbon atom(s), for example, acetyloxy and benzoyloxy), a carbamoyl group (preferably a carbamoyl group having 1 to 20 carbon atom(s), for example, N,N-dimethylcarbamoyl and N-phenylcarbamoyl), an acylamino group (preferably an acylamino group having 1 to 20 carbon atom(s), for example, acetylamino and benzoylamino), a sulfonamide group (preferably a sulfonamide group having 0 to 20 carbon atom(s) for example, methanesulfonamide, benzenesulfonamide, N-methylmethanesulfonamide, N-ethylbenzenesulfonamide), an alkylthio group (preferably an alkylthio group having 1 to 20 carbon atom(s), for example, methylthio, ethylthio, isopropylthio, benzylthio), an arylthio group (preferably an arylthio group having 6 to 26 carbon atoms, for example, phenylthio, 1-naphthylthio, 3-methylphenylthio, 4-methoxyphenylthio), an alkyl- or aryl-sulfonyl group (preferably an alkyl- or aryl-sulfonyl group having 1 to 20 carbon atoms, for example, methylsulfonyl, ethylsulfonyl, benzenesulfonyl), a hydroxyl group, a cyano group, a halogen atom (for example, a fluorine atom, a chlorine atom, a bromine atom, and an iodine atom). Among them, an alkyl group, an alkenyl group, an aryl group, a heterocyclic group, an alkoxy group, an aryloxy group, an alkoxycarbonyl group, an amino group, an acylamino group, a hydroxyl group, and a halogen atom are more preferable. An alkyl group, an alkenyl group, a heterocyclic group, an alkoxy group, an alkoxycarbonyl group, an amino group, an acylamino group, and a hydroxyl group are particularly preferable.

Further, each of these groups exemplified as the substituent T may be substituted with the above-described substituent T.

When a compound, a substituent, a linking group or the like contains an alkyl group, an alkylene group, an alkenyl group, an alkenylene group or the like, these groups may be a cyclic group or a chain group, may be linear or branched, and may be substituted or unsubstituted as described above. Furthermore, when the compound, the substituent, the linking group or the like contains an aryl group, a heterocyclic group or the like, they may be monocyclic or fused-cyclic, and may be substituted or unsubstituted in the same manner.

(Aqueous Medium)

The etching liquid of the present invention is preferably an aqueous solution in which water (aqueous medium) is applied as a medium and each of components contained therein is uniformly dissolved. The content of water is preferably from 50 to 99.5% by mass and more preferably from 55 to 95% by mass, with respect to the total mass of the etching liquid. Thus, a composition composed primarily of water (50% by mass or more) is sometimes called as an aqueous composition in particular, and preferable in terms of more inexpensive and more adaptable to the environment, compared to a composition with a high ratio of an organic solvent. It is preferable from this viewpoint that the etching liquid of the present invention is an aqueous composition. The water (aqueous medium) may be an aqueous medium containing components dissolved therein in an amount by which the effects of the present invention are not deteriorated, or may contain inevitable small amount of mixed components. Especially, water which has been subjected to a purifying process, such as distilled water, ion-exchanged water and ultrapure water, is preferable and the ultrapure water which is used for production of the semiconductor is particularly preferable.

(Kit)

The etching liquid of the present invention may be constituted as a kit in which the raw materials thereof are divided into multiple parts. Examples of the kit include an embodiment in which, as a first liquid, a liquid composition in which the above-described ammonia compound is contained in an aqueous medium is prepared, and, as a second liquid, a liquid composition in which the above-described oxidizing agent is contained in an aqueous medium is prepared. As an example of the use thereof, preferred is an embodiment in which both liquids are mixed to prepare an etching liquid, and after that, the etching liquid is applied to the above-described etching process on a timely basis. This avoids the etching liquid from causing deterioration of the liquid properties due to decomposition of the oxidizing agent (for example, hydrogen peroxide) whereby a desired etching function can be effectively exhibited. Herein, the term "on a timely basis (timely)" after mixing means a period of time prior to a desired function being lost after mixing. Specifically, the period of time is preferably within 60 minutes, more preferably within 30 minutes, and particularly preferably within 10 minutes. Although there is no lower limit in particular, the period of one second or longer is practical.

The concentration of the ammonia compound in the first liquid, although it is not particularly limited, is preferably 0.5% by mass or more and more preferably 1.5% by mass or more. The upper limit thereof is preferably 30% by mass or less and more preferably 20% by mass or less. By setting the concentration to the above-described range, a condition suitable for mixing with the second liquid can be achieved and a favorable concentration region in the above-described etching liquid can preferably be achieved.

The concentration of the oxidizing agent in the second liquid, although it is not particularly limited, is preferably 1% by mass or more and more preferably 2% by mass or more. The upper limit thereof is preferably 70% by mass or less and more preferably 50% by mass or less. By setting the concentration to the above-described range, a condition suitable for mixing with the first liquid can be achieved and a favorable concentration region in the above-described etching liquid can preferably be achieved.

In the case where the above-described surface uniformizing agent is used, it is preferable that the surface uniformizing agent is preliminarily added to the first liquid side. Alternatively, a liquid composition in which a water-soluble organic solvent has been added to an aqueous medium is preliminarily prepared and the liquid composition may be mixed as a third liquid with the first liquid and the second liquid.

Figure 3:
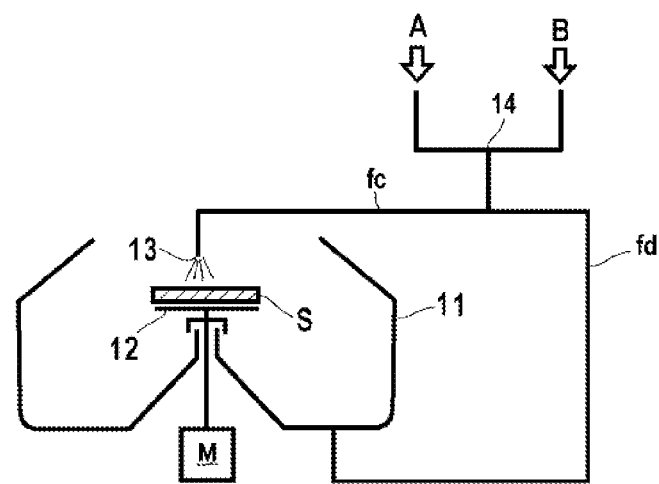
FIG. 3 is a configuration diagram showing a part of the wet-etching equipment according to a preferable embodiment of the present invention.

The procedure for mixing the first liquid with the second liquid, although it is not limited, is preferably a method of putting the first liquid and the second liquid into circulation in a separate flow channel and making them converge at the junction portion of the flow channels, thereby mixing them. After that, it is preferable that the etching liquid obtained by convergence is further put into circulation in a flow channel and then discharged or sprayed from a discharge opening, thereby bringing it contact with a semiconductor substrate. In this embodiment, a step of from converging-mixing at the junction portion to contacting with the semiconductor substrate is preferably conducted "on a timely basis (timely)" described above. This is explained below by using FIG. 3. The prepared etching liquid is sprayed from discharge opening 13 and applied onto the upper surface of semiconductor substrate S in reaction container 11. In the embodiment shown in the figure, two liquids of A and B are supplied and converged at junction portion 14. After that, the mixture is moved to discharge opening 13 through flow channel fc. Flow channel fd shows a return path for reuse of the chemical liquid. It is preferable that semiconductor substrate S is placed on rotating table 12 and rotated together with rotating table 12 by means of rotary drive member M. Note that the embodiment using substrate-rotation-type equipment can be also similarly applied to a processing using an etching liquid which is not used in a kit form.

(Container)

The etching liquid of the present invention (whether it is a kit or not) can be stored, transported and used by filling it into an arbitrary container, as far as corrosion resistance properties and the like are not concerned. Further, for semiconductor application, it is preferred that the container have high cleanness and less elution of impurities therefrom. Examples of available containers include "CLEAN BOTTLE" series manufactured by AICELLO CORPORATION, and "PURE BOTTLE" manufactured by KODAMA PLASTICS Co., Ltd. However, the present invention is not limited to these. Note that the above container can be used similarly regardless of whether the etching liquid of the present invention is for the kit or for the one liquid.

[Conditions of Etching]

In the present embodiment, the conditions for etching are not particularly limited. Either single wafer type (spray-type) etching or immersion type (batch type) etching may be applicable. In the spray-type etching, a semiconductor substrate is transported or rotated in the prescribed direction and an etching liquid is sprayed into the space, thereby bringing the etching liquid into contact with the semiconductor substrate. On the other hand, in the batch-type etching, a semiconductor substrate is immersed in a liquid bath constituted of an etching liquid, thereby bringing the etching liquid into contact with the semiconductor substrate in the liquid bath. These etching processes may be appropriately used depending on the structure, the material, and the like of a device.

The environmental temperature at which etching is conducted is preferably 40° C. or higher, more preferably 50° C. or higher, and particularly preferably 55° C. or higher, in the measurement method of temperature in Examples below. The upper limit thereof is preferably 80° C. or lower, and more preferably 70° C. or lower. By setting to the above-described lower limit or higher, a sufficient etching rate to the TiN layer can preferably be ensured. By setting the temperature to the above-described upper limit or lower, stability with age of the etching rate can preferably be maintained. The feeding rate of the etching liquid, although it is not particularly limited, is preferably set within the range from 0.05 to 5 L/min, more preferably from 0.05 to 1 L/min, and particularly preferably from 0.1 to 0.5 L/min. By setting to the above-described lower limit or greater, in-plane uniformity of etching can preferably be secured at more excellent level. By setting to the above-described upper limit or lower, stable selectivity at the time of continuous processing can preferably be secured. In the case of rotating a semiconductor substrate, although it varies depending on the size or the like, from the same viewpoint as the above, it is preferable to rotate the semiconductor substrate at the rate of 50 to 1000 rpm, more preferably at the rate of 50 to 400 rpm.

In the case of the batch type, it is also preferable to control the liquid bath to the above-described temperature range from the same reason as the above. The immersing time of the semiconductor substrate, although it is not particularly limited, is preferably set to be from 0.5 to 30 minutes and more preferably from 1 to 10 minutes. By setting to the above-described lower limit or longer, in-plane uniformity of etching can preferably be secured. By setting to the above-described upper limit or lower, the performance required for reuse of the etching liquid can preferably be maintained.

In the single wafer type etching according to a preferable embodiment of the present invention, it is preferable to transport or rotate a semiconductor substrate in the prescribed direction and to spray an etching liquid into the space, thereby bringing the etching liquid into contact with the semiconductor substrate. The feeding rate of the etching liquid and the rotation rate of the semiconductor substrate are the same as already described earlier.

Figure 4:
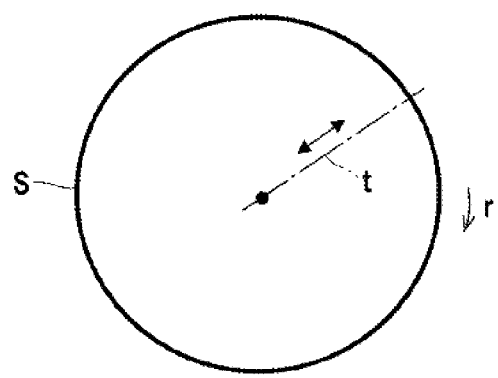
FIG. 4 is a top view diagrammatically showing the moving-track-line of the nozzle with respect to the semiconductor substrate according to one embodiment of the present invention.

In the single wafer type etching equipment configuration according to a preferable embodiment of the present invention, it is preferable to provide an etching liquid while moving a discharge opening (nozzle), as shown in FIG. 4. Specifically, in the present embodiment, when an etching liquid is applied onto semiconductor substrate S having a Ti-containing layer, the substrate is made to rotate in the r direction. On the other hand, the discharge opening is designed to move along with moving-track-line t extending from the central portion of the semiconductor substrate to the edge thereof. Thus, in the present embodiment, the rotation direction of the substrate and the moving direction of the discharge opening are set so as to be a different direction from one another whereby they are subjected to a relative movement with respect to one another. As a result, the configuration is such that an etching liquid can be evenly applied onto the entire surface of the semiconductor substrate whereby the uniformity of etching is favorably secured.

The moving rate of the discharge opening (nozzle), although it is not particularly limited, is preferably 0.1 cm/s or more, more preferably 1 cm/s or more. On the other hand, the upper limit is preferably 30 cm/s or less, more preferably 15 cm/s or less. The moving-track-line may be a straight line or a curve (for example, arc-like). In each case, the moving rate can be calculated from an actual length of the track-line and the time it takes for movement.

[Residue]

The production process of the semiconductor device may include a step of etching a metal layer or the like on a semiconductor substrate by a plasma etching technique using a resist pattern or the like as a mask. Specifically, etching of the metal layer, a semiconductor layer, an insulating layer, and the like is conducted, thereby patterning the metal layer and the semiconductor layer, or forming, on the insulating layer, an opening portion such as a via hole and a wiring groove. In the plasma etching, a residue derived from the resist used as a mask, and the metal layer, the semiconductor layer, and the insulating layer to be etched may be produced on the semiconductor substrate. In the present invention, the residue produced by the plasma etching as described above is called as "a plasma etching residue". The "plasma etching residue" includes an etching residue derived from the above-described third layer (SiON, SiOC, and the like).

Further, the resist pattern used as a mask is removed after etching. In order to remove the resist pattern, as described above, a wet method using a stripper liquid, or a dry method in which ashing is conducted using, for example, plasma or ozone, is used. In the ashing, a converted residue of the plasma etching residue produced by the plasma etching and a residue derived from the resist to be removed are produced on the semiconductor substrate. In the present invention, the residue produced by the ashing as described above is called as an "ashing residue". Further, as the general term for the residual matter which is produced on the semiconductor substrate and should be removed by washing, such as the plasma etching residue and the ashing residue, they may be simply called as a "residue".

The plasma etching residue and the ashing residue which are the residue after such etching (Post Etch Residue) are preferably washed and removed using a washing composition. The etching liquid according to the present embodiment can also be applied as a washing liquid for removing the plasma etching residue and/or the ashing residue. Especially, the etching liquid is preferably used to remove both the plasma etching residue and the ashing residue after the plasma ashing which is conducted in succession to the plasma etching.

[Material to be Processed]

A material, which is etched by applying thereto the etching liquid according to the present embodiment, may be arbitrarily used. However, it is required that a substrate having a first layer containing TiN is applied. Herein, the term "layer containing TiN (TiN layer)" means that the layer may contain oxygen. When the TiN layer is especially used to distinguish it from a layer which does not contain oxygen, it may be called as a TiON layer or the like. In the present invention, the oxygen content of the TiN layer is 10% by mole or less, preferably 8.5% by mole or less and more preferably 6.5% by mole or less. The lower limit side is 0.1% by mole or more, preferably 2% by mole or more, and more preferably 4% by mole or more.

In the present invention, it is important that the surface oxygen concentration of the TiN-containing layer in this substrate is set to the above range. By setting to the above lower limit or greater and the above upper limit or less, the in-plane uniformity after etching of TiN can be achieved. Such surface uniformization effect becomes remarkable by using single wafer-type etching equipment. Further, this effect becomes also remarkable by applying it as a kit in which a plurality of liquids are combined.

Such adjustment of the oxygen concentration in the TiN layer in the substrate can be conducted by, for example, adjustment of the oxygen concentration in a processing room for CVD at the time of forming the TiN layer. Note that the first layer contains TiN as a major ingredient and may contain other ingredients within a range in which the effect of the present invention is exerted. This is true on the other layer such as the second layer, the metal layer and the like.

The above-described first layer is preferably subjected to etching at high etching rate. The thickness of the first layer is not particularly limited. However, when compositions of ordinary devices are considered, it is practical that the thickness is approximately from 0.005 to 0.3 µm. The etching rate (R1) of the first layer is not particularly limited. However, considering production efficiency, the etching rate is preferably 50 Å/min or more, more preferably 100 Å/min or more, and particularly preferably 200 Å/min or more. The upper limit is not limited in particular. However, it is practical that the upper limit is 1000 Å/min or less.

The method according to the present invention is preferably applied to a semiconductor substrate having a second layer containing a metal such as Cu, W, Co, Ni, Ag, Ta, Hf, Pt, Au or the like. Above all, Cu or W is preferably used as a material for the second layer.

Here, the technical significance of the metal layer is explained on the basis of an example in which copper (Cu) and tungsten (W) are used as a material thereof. Recently, in response to demands for speed-up of the semiconductor device (semiconductor equipment), miniaturization of wiring pattern, and high integration, reduction in capacity between wirings, improvement in electrical conductivity of the wire and improvement in electromigration resistance have been required. As regards the techniques for addressing these requirements, a multilayer-wiring technique of using copper which has high electrical conductivity and excellent electromigration resistance as a wire material and using a low dielectric constant layer (Low-K layer) as an insulation layer between layers has attracted attention. This copper wiring is generally disposed by a Dual Damascene process, on a copper seed layer (for example, dual layer composed of tantalum (Ta) and tantalum nitride (TaN)) which acts as a copper diffusion-preventing film for preventing copper from diffusion in the copper wiring.

On the other hand, contact of the semiconductor device is disposed through a tungsten plug by a single Damascene process in place of the Dual Damascene process which is ordinarily used at the time of forming a copper wiring and a via hole. In such multilayer-wiring technique, a Damascene method of forming a concave portion such as a wiring gutter, a through hole, and the like in a low dielectric constant layer and thereby burying therein copper is adopted. In this case, in order to form the concave portion with accuracy in the low dielectric constant layer by etching, it is necessary to use a mask composed of a material which has an adequately high-selection ratio to the low dielectric constant layer, as a mask to be used when the low dielectric constant layer is etched.

As the above low dielectric constant layer, an organic material is generally used, and as a result, in the case of etching the low dielectric constant layer using, as a mask, a photoresist layer composed of the same organic material as the above, it is presumed that the selection ratio becomes insufficient. In order to dissolve such problem, it has been proposed to use a hard mask layer composed of an inorganic material such as a TiN film, as a mask to be used at the time of etching. Further, removal of this hard mask layer is needed in the process after etching of the low dielectric constant layer. In particular, in the wet etching process, an accurate removal of the above hard mask without excessively corroding or non-uniformalizing a metal layer such as tungsten plug and the like, or other wiring and/or low dielectric constant layer materials is desired.

The first layer (TiN) layer which constitutes a hard mask in the embodiment as described above is removed. As a result, the metal layer (second layer) is expected to be located at the bottom of a via-hole or a trench (see FIG. 1 and FIG. 2).

The etching rate [R2] of the second layer (metal layer) is not limited in particular. However, it is preferable that the second layer is not removed to excess. The etching rate is preferably 100 Å/min or more, and more preferably 50 Å/min or more. The lower limit, although it is not limited in particular, is 0.001 Å/min or more for practical purposes.

The exposed width (d in the figure) of the metal layer is not limited in particular. However, from the viewpoint that advantages of the present invention become more remarkable, the exposed width is preferably 2 nm or more, and more preferably 4 nm or more. In a similar way, from the viewpoint of conspicuity of the effect, the upper limit is 1000 nm or less for practical purposes, preferably 100 nm or less, and more preferably 20 nm or less.

Further, the method of the present invention is also preferably applied to a semiconductor substrate having a third layer containing a metal compound such as SiO, SiN, SiOC, SiON, or the like. Note that in the present specification, when the composition of a metal compound is expressed by a combination of elements thereof, the composition means that compositions having arbitrary percentage of the elements are incorporated in a broad sense. For example, SiO means that it incorporates a thermally-oxidized film of silicon and $SiO_2$, and includes $SiO_x$. This is the common definition in the present specification, so that same applies to other metal compounds. It is preferable that the third layer is also subjected to surface uniformization. The etching rate [R3] of the third layer, although it is not limited in particular, is preferably the same range as the above etching rate [R2] of the second layer.

Note that the invention disclosed in JP-A-2010-10273 utilizes a TiN film. However, this relates to an intended use of the insulation film. In the TiN film as an insulation film, its surface oxygen concentration is increased in order to enhance insulation properties, and its concentration ordinarily exceeds 10% by mole. A metal hard mask (MHM) is a subject for utilization of the TiN film according to a preferred embodiment of the present invention, so that the insulation properties are not always required. As a result, the surface oxygen concentration can be adjusted in response to etching properties and the like.

[Production of Semiconductor Substrate Product]

In the present embodiment, a semiconductor substrate product having a desired structure is preferably produced through a step of providing a semiconductor substrate by forming the above-described first layer and second layer on a silicon wafer and a step of applying the etching liquid onto the semiconductor substrate thereby selectively removing the first layer. At this moment, the above-described specific etching liquid is used for etching.

Note that, as regards each of the steps involved in the etching and each of the steps involved in the production of the semiconductor substrate product, it is allowed to rearrange the order of the steps arbitrarily and to apply them within a range in which the effect of the present invention is exerted. Further, the expression "preparation" means to prepare a particular material by synthesis or blend and in addition, to include procurement of prescribed materials by purchase or the like. Further, in the present specification, to utilize an etching liquid so as to etch each material of the semiconductor substrate is called "application". The embodiment thereof is not limited in particular. For example, this term is broad enough to include any embodiment of bringing an etching liquid and a semiconductor substrate into contact. Specifically, etching may be carried out by immersion using batch-type equipment, or may be carried out by discharge using single wafer-type equipment.

EXAMPLES

The present invention will be described in more detail based on examples given below, but the invention is not meant to be limited by these. Note that the amount and ratio shown in the Examples are based on mass standard, unless otherwise indicated.

Example 1, Comparative Example 1

Etching liquids were prepared to contain the components shown in the following Table 1 in accordance with the compositions (% by mass) shown in the same table. Note that the balance is water (ultra-pure water).

(Method of Forming a TiN Substrate)

A TiN film having a surface oxygen concentration of 6.1% by mole was formed on a commercially available silicon substrate by CVD (Chemical Vapor Deposition). Further, as regards Example 2, the metal layer in the Table was formed next to the TiN layer similarly by CVD to use as a test substrate. At the time of carrying out CVD, by controlling a low level of oxygen concentration in the gas phase, substrates having a different oxygen concentration from one another and substrates having a different diameter from one another were prepared. As regards the substrate having an oxygen concentration of 12.2%, a commercially available TiN substrate (manufactured by Silicon Valley microelectronics, Inc.) was used as it is. Note that the above substrates were prepared so that the metal layer had a width (d) of about 3 cm.

(Surface Oxygen Concentration)

Regarding a surface oxygen concentration of the TiN layer, concentration profiles of Ti, 0 and N in the depth direction from 0 to 30 nm were measured using etching ESCA (Quantera manufactured by ULVAC-PHI, INCORPORATED) and each of the contents at the depth of from 5 to 10 nm was calculated. An average of the oxygen contents was defined as the surface oxygen concentration.

(Etching Test)

With respect to the above-described test substrates, etching was carried out under the following conditions using single wafer-type equipment (POLOS (trade name) manufactured by SPS-Europe B.V.) and evaluation tests were carried out.

Processing temperature: 57° C.
Discharge rate: 1 L/min.
Wafer rotation number: 500 rpm (Measurement Method of Processing Temperature)

A radiation thermometer IT-550F (trade name) manufactured by HORIBA, Ltd. was fixed at the height of 30 cm above the wafer in single wafer type equipment. The thermometer was pointed onto the wafer surface of 2 cm outside of the wafer center, and temperature measurement was conducted while making a chemical liquid flow. The temperature was measured by digital output from the radiation thermometer and continuously recorded on a personal computer. Among them, an averaged value of the temperature during the period of 10 seconds after stabilization of the temperature was used as a temperature on the wafer.

[Evaluation of in-Plane Uniformity]

Condition setting required for the etching depth at the center of a circular substrate was conducted at different time periods whereby the time period required to be 300 Å of the etching depth was confirmed. Then, the entire substrate was again etched at the confirmed time period, and at this moment, the measurement of the obtained etching depth was conducted at the centrally-directed position of 30 mm from the periphery of the substrate. Evaluation was conducted on the condition that as the depth is near 300 Å, in-plane uniformity becomes high. Specific criteria are as follows. This expresses as a difference between the center position and the 30 mm position (an average of five point data).

AAA ±5 Å or less
AA ± more than 5 Å and 12 Å or less
A ± more than 12 Å and 15 Å or less
B ± more than 15 Å and 20 Å or less
C ± more than 20 Å and 30 Å or less
D ± more than 30 Å and 50 Å or less
E ± more than 50 Å

(Measurement of pH)

The pH in Table is a value obtained by measurement at room temperature (25° C.) using F-51 (trade name) manufactured by HORIBA, Ltd.

(Annotation of the Table)

Tests beginning with C indicate Comparative Examples.

The substrate having a surface oxygen concentration of 6.1% was used.

The content of $H_2O_2$ was calculated from the concentration (30% by mass) of the used hydrogen peroxide water.

The content of $NH_3$ was calculated from the concentration (25% by mass) of the used ammonia water.

From the above results, it is found that according to the present invention, in conjunction with suitable removal of TiN, good in-plane uniformity after etching of the TiN layer and the W layer can be hold.

Further, a substrate wherein TiN and Cu were provided together was prepared and a similar experiment was carried out. As a result, a similar result was also obtained in terms of the in-plane uniformity of Cu.

Example 2, Comparative Example 2

Etching tests were carried out in the same manner as Example 1, except that the etching liquid to be used and the surface oxygen concentration of the TiN layer were changed as shown in Table 2. The results are shown in Table 2.

TABLE 1

| Test No. | $H_2O_2$ (% by mass) | $NH_3$ (% by mass) | Surface uniformizing agent Kind | Surface uniformizing agent (% by mass) | Water | Substrate Diameter (mm) | In-plane uniformity TiN | In-plane uniformity W |
|---|---|---|---|---|---|---|---|---|
| 101 | 24% | 5% | — | 0% | balance | 150 | B | B |
| 102 | 17% | 11% | — | 0% | balance | 150 | C | C |
| 103 | 26% | 3% | — | 0% | balance | 150 | B | C |
| 104 | 18% | 10% | — | 0% | balance | 150 | C | C |
| 105 | 18% | 10% | — | 0% | balance | 150 | C | C |
| 106 | 23% | 5% | I-1 | 3% | balance | 150 | AA | AA |
| 107 | 23% | 5% | I-2 | 3% | balance | 150 | AA | AA |
| 108 | 23% | 5% | I-3 | 3% | balance | 150 | AAA | AAA |
| 109 | 23% | 5% | I-4 | 3% | balance | 150 | AA | AAA |
| 110 | 23% | 5% | I-5 | 3% | balance | 150 | A | A |
| 111 | 23% | 5% | I-6 | 3% | balance | 150 | AA | AAA |
| 112 | 23% | 5% | VII-2-2 | 3% | balance | 150 | AA | AAA |
| 113 | 23% | 5% | VII-2-3 | 3% | balance | 150 | AA | AA |
| 114 | 23% | 5% | VII-2-4 | 3% | balance | 150 | A | B |
| 115 | 23% | 5% | III-1 | 3% | balance | 150 | AAA | AAA |
| 116 | 23% | 5% | III-2 | 3% | balance | 150 | AA | AAA |
| 117 | 23% | 5% | III-3 | 3% | balance | 150 | AA | AAA |
| 118 | 23% | 5% | IX-1 | 3% | balance | 150 | A | B |
| 119 | 23% | 5% | III-4 | 3% | balance | 150 | B | B |
| 120 | 23% | 5% | IV-1 | 3% | balance | 150 | AA | AA |
| 121 | 23% | 5% | III-5 | 3% | balance | 150 | A | AA |
| 122 | 23% | 5% | VII-3-1 | 3% | balance | 150 | AA | AA |
| 123 | 23% | 5% | VII-3-2 | 3% | balance | 150 | A | AA |
| 124 | 23% | 5% | V-1 | 3% | balance | 150 | AA | AA |
| 125 | 23% | 5% | V-2 | 3% | balance | 150 | A | A |
| 126 | 23% | 5% | V-3 | 3% | balance | 150 | B | A |
| 127 | 23% | 5% | V-4 | 3% | balance | 150 | B | A |
| 128 | 23% | 5% | VIII-1 | 3% | balance | 150 | A | A |
| 129 | 23% | 5% | VII-4-1 | 3% | balance | 150 | AA | AA |
| 130 | 23% | 5% | VII-1-1 | 3% | balance | 150 | A | A |
| 131 | 23% | 5% | VII-1-2 | 3% | balance | 150 | A | AA |
| C11 | 30% | 0% | — | 0% | balance | 150 | D | Surface roughness |
| C12 | 0% | 25% | — | 0% | balance | 150 | Surface roughness | Surface roughness |

TABLE 2

| Test No. | H$_2$O$_2$ (% by mass) | NH$_3$ (% by mass) | Surface uniformizing agent Kind | (% by mas) | water | No. | TiN substrate O$_2$ Concentration % by mole | Substrate Diameter (mm) | TiN In-plane uniformity |
|---|---|---|---|---|---|---|---|---|---|
| 201 | 23% | 5% | VII-2-2 | 3% | balance | 1 | 0.1 | 150 | C |
| 202 | 23% | 5% | VII-2-3 | 3% | balance | 2 | 1.9 | 150 | B |
| 203 | 23% | 5% | VII-2-4 | 4% | balance | 3 | 4 | 150 | A |
| 204 | 23% | 5% | III-1 | 4% | balance | 4 | 6.1 | 150 | AA |
| 205 | 23% | 5% | III-2 | 5% | balance | 5 | 8.1 | 150 | B |
| 206 | 23% | 5% | III-3 | 5% | balance | 6 | 10.0 | 150 | C |
| C21 | 22% | 5% | IX-1 | 5% | balance | 7 | less than 0.1 | 150 | D |
| C21 | 22% | 5% | III-4 | 6% | balance | 8 | 12.2 | 150 | D |

From the above results, it is found that the present invention excels in the in-plane uniformity of the first layer (W layer) and the first layer (TiN layer) after etching due to optimization of the surface oxygen concentration of the TiN layer (first layer).

Example 3

Etching tests were carried out in the same manner as No. 101 in Example 1, except that the etching conditions were changed as in the following Table 3. The results are shown in the following table.

TABLE 3

| No. | Equipment | Processing temperature (° C.) | Liquid-feeding form | Elapsed time (min) | Substrate diameter (mm) | In-plane uniformity TiN | In-plane uniformity W |
|---|---|---|---|---|---|---|---|
| 301 | SWT | 70 | 1 | — | 150 | B | B |
| 302 | SWT | 70 | 1 | — | 100 | C | C |
| 303 | SWT | 70 | 1 | — | 200 | A | A |
| 304 | SWT | 70 | 1 | — | 300 | AA | AA |
| 305 | BT | 70 | — | — | 150 | C | C |
| 306 | SWT | 80 | 1 | — | 150 | C | C |
| 307 | SWT | 60 | 1 | — | 150 | A | A |
| 308 | SWT | 50 | 1 | — | 150 | B | B |
| 309 | SWT | 40 | 1 | — | 150 | C | C |
| 310 | SWT | 70 | 2 | 10 | 150 | A | A |
| 311 | SWT | 70 | 2 | 8 | 150 | A | A |
| 312 | SWT | 70 | 2 | 5 | 150 | A | A |
| 313 | SWT | 70 | 2 | 3 | 150 | AA | AA |
| 314 | SWT | 70 | 2 | ≤1 | 150 | AA | AA |

(Annotation of the Table)
SWT: Nozzle swing single wafer-type equipment
POLOS (product name) manufactured by SPS-Europe B.V.
Batch type: Batch type equipment
MANUAL WET BENCH (product name) manufactured by Seto Giken Kogyo Co., Ltd.
Liquid-feeding form
1: A liquid chemical was prepared and applied as one liquid (the liquid was applied immediately after the liquid preparation).
2: A liquid chemical kit having two liquids was prepared and mixed (the equipment in FIG. 3 was used).
Elapsed time from mixing: time elapsing from when a liquid chemical kit having two liquids was mixed till when the mixture was applied to a substrate From the above results, it is found that both production methods of using single wafer-type equipment as well as mixing liquids by using a kit having two liquids are also preferable embodiments that improve the in-plane uniformity of the metal layer.

Having described our invention as related to the present embodiments, it is our intention that the invention not be limited by any of the details of the description, unless otherwise specified, but rather be construed broadly within its spirit and scope as set out in the accompanying claims.

REFERENCE SIGNS LIST

1 TiN layer (first layer)
2 SiON layer (third layer (1))
3 SiOC layer (third layer (2))
4 Cu/W layer (second layer)
5 via
10, 20 semiconductor substrate
11 reaction container
12 rotating table
13 discharge opening
14 junction portion
S substrate

The invention claimed is:

1. An etching method comprising the step of:
processing a substrate having a first layer containing titanium nitride (TiN) and a second layer containing a transition metal by bringing an etching liquid into contact with the substrate and thereby removing the first layer,
wherein the first layer has a surface oxygen content from 0.1 to 10% by mole,
wherein the etching liquid comprises an ammonia compound and an oxidizing agent, and has a pH of from 7 to 14.

2. The etching method according to claim 1, wherein the transition metal is selected from Co, Ni, Cu, Ag, Ta, Hf, W, Pt and Au.

3. The etching method according to claim 1, wherein the ammonia compound is ammonia or a salt thereof.

4. The etching method according to claim 1, wherein the oxidizing agent is a nitric acid or a hydrogen peroxide.

5. The etching method according to claim 1, wherein an etching rate (R1) of the first layer is 200 Å/min or greater and less than 1000 Å/min.

6. The etching method according to claim 1, wherein the etching liquid further contains at least one surface uniformizing agent selected from the group consisting of a nitrogen-containing organic compound, an aromatic compound and an oxygen-containing organic compound.

7. The etching method according to claim 6, wherein the surface uniformizing agent includes a compound represented by any one of the following formulae (I) to (IX):

(I)
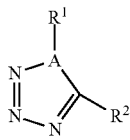

(II)
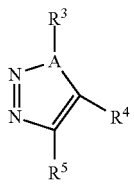

(III)
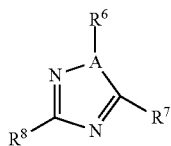

(IV)
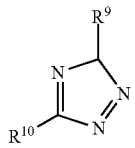

(V)
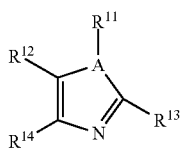

(VI)
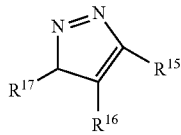

(VII)
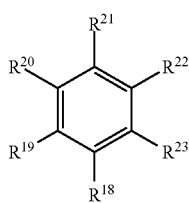

(VIII)
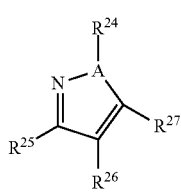

(IX)
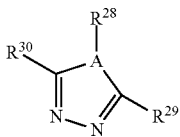

wherein, $R^1$ to $R^{30}$ each independently represent a hydrogen atom or a substituent; in this case, neighbors adjacent to each other may be linked or ring-fused to form a cyclic structure; A represents a hetero atom with the proviso that when A is divalent, there exists none of $R^1$, $R^3$, $R^6$, $R^{11}$, $R^{24}$ and $R^{28}$ by which A is each substituted.

8. The etching method according to claim 7, wherein the surface uniformizing agent includes a compound selected from the following groups:

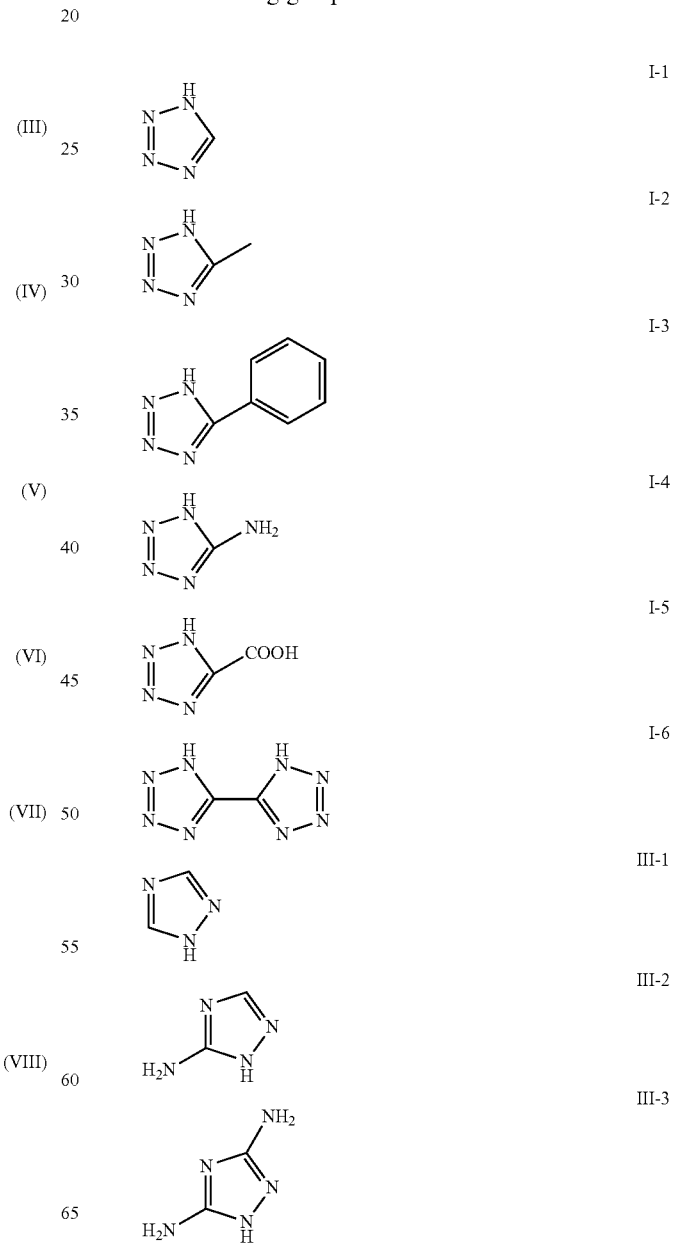

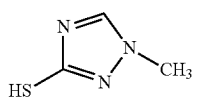
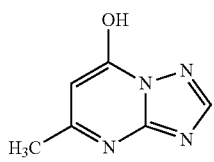
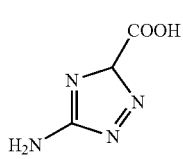
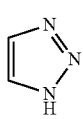
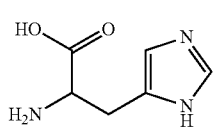
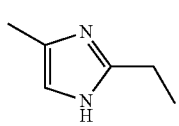
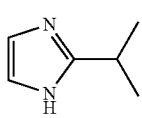
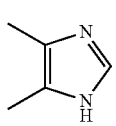
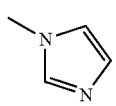
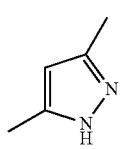
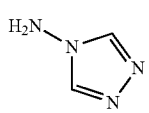
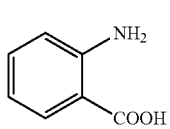

III-4
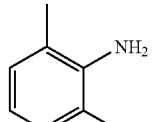

III-5
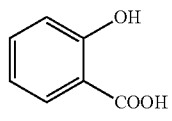

IV-1
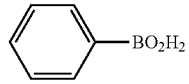

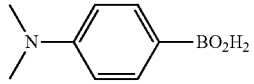

II-1
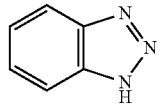

V-1
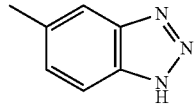

V-2
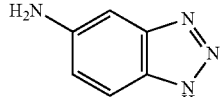

V-3
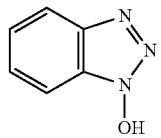

V-4
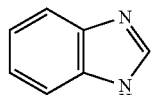

V-5
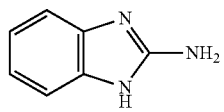

VIII-1
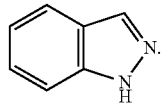

9. The etching method according to claim 6, wherein the surface uniformizing agent is at least one selected from the group consisting of an alcohol compound solvent having 2 to 15 carbon atoms and an ether compound solvent having 2 to 15 carbon atoms.

10. The etching method according to claim 6,
wherein the surface uniformizing agent is contained in a range of from 0.01 to 10% by mass,
wherein the ammonia compound is contained in a range of from 0.1 to 15% by mass, and wherein the oxidizing agent is contained in a range of from 0.5 to 50% by mass.

11. The etching method according to claim 1, comprising the steps:
mixing a first liquid containing the ammonia compound and a second liquid containing the oxidizing agent to prepare the etching liquid; and then on a timely basis,
bringing the etching liquid into contact with the substrate thereby processing it.

12. The etching method according to claim 1,
wherein a thickness of the first layer is from 0.005 to 0.3 μm, and
wherein the width of the second layer is 2 nm or more and less than 1000 nm.

13. A method of producing a semiconductor device comprising: removing a first layer containing titanium nitride (TiN) by the etching method according to claim 1; and then producing the semiconductor device from the remaining substrate.

14. An etching liquid that processes a substrate having a first layer containing titanium nitride (TiN) and a second layer containing a transition metal, and that is applied by selecting the substrate in which a surface oxygen content of the first layer is from 0.1 to 10% by mole, wherein the etching liquid is an etching liquid having a pH of from 7 to 14, that contains an ammonia compound and an oxidizing agent.

15. The etching liquid according to claim 13,
wherein the ammonia compound is contained in a range of from 0.1 to 15% by mass, and
wherein the oxidizing agent is contained in a range of from 0.5 to 50% by mass.

16. The etching liquid according to claim 13, further containing at least one surface uniformizing agent selected from the group consisting of a nitrogen-containing organic compound, an aromatic compound and an oxygen-containing organic compound.

17. A kit for preparing an etching liquid, comprising a first liquid containing an ammonia compound and a second liquid containing an oxidizing agent in combination, wherein the kit is composed of the etching liquid having a pH of from 7 to 14, that processes a substrate having a first layer containing titanium nitride (TiN) and a second layer containing a transition metal, and said etching liquid is applied by selecting the substrate in which a surface oxygen content of the first layer is from 0.1 to 10% by mole.

18. The kit for preparing the etching liquid according to claim 16, wherein at least one surface uniformizing agent selected from the group consisting of a nitrogen-containing organic compound, an aromatic compound and an oxygen-containing organic compound is further contained in at least one of the first liquid and the second liquid, or a third liquid other than the first liquid and the second liquid.

19. An etching method comprising the step of:
processing a substrate having a first layer containing titanium nitride (TiN) and a second layer containing a transition metal by bringing an etching liquid into contact with the substrate and thereby removing the first layer,
wherein the first layer has a surface oxygen content from 0.1 to 10% by mole,
wherein the etching liquid consists of an ammonia compound and an oxidizing agent and water, and has a pH of from 7 to 14.

20. The etching method according to claim 19, wherein the transition metal is selected from Co, Ni, Cu, Ag, Ta, Hf, W, Pt and Au.

21. The etching method according to claim 19, wherein the ammonia compound is ammonia or a salt thereof.

22. The etching method according to claim 19, wherein the oxidizing agent is a nitric acid or a hydrogen peroxide.

23. The etching method according to claim 19, wherein an etching rate (R1) of the first layer is 200 Å/min or greater and less than 1000 Å/min.

24. The etching method according to claim 19, comprising the steps:
mixing a first liquid containing the ammonia compound and a second liquid containing the oxidizing agent to prepare the etching liquid; and then on a timely basis,
bringing the etching liquid into contact with the substrate thereby processing it.

25. The etching method according to claim 19,
wherein a thickness of the first layer is from 0.005 to 0.3 μm, and
wherein the width of the second layer is 2 nm or more and less than 1000 nm.

26. A method of producing a semiconductor device comprising: removing a first layer containing titanium nitride (TiN) by the etching method according to claim 19; and then producing the semiconductor device from the remaining substrate.

27. An etching liquid that processes a substrate having a first layer containing titanium nitride (TiN) and a second layer containing a transition metal, and that is applied by selecting the substrate in which a surface oxygen content of the first layer is from 0.1 to 10% by mole, wherein the etching liquid is an etching liquid having a pH of from 7 to 14, that consists of an ammonia compound and an oxidizing agent and water.

28. The etching liquid according to claim 27,
wherein the ammonia compound is contained in a range of from 0.1 to 15% by mass, and
wherein the oxidizing agent is contained in a range of from 0.5 to 50% by mass.

29. A kit for preparing an etching liquid, comprising a first liquid consisting of an ammonia compound and water and a second liquid consisting of an oxidizing agent and water in combination, wherein the kit is composed of the etching liquid having a pH of from 7 to 15, that processes a substrate having a first layer containing titanium nitride (TiN) and a second layer containing a transition metal, and said etching liquid is applied by selecting the substrate in which a surface oxygen content of the first layer is from 0.1 to 10% by mole.

30. An etching method comprising the step of:
processing a substrate having a first layer containing titanium nitride (TiN) and a second layer containing a transition metal by bringing an etching liquid into contact with the substrate and thereby removing the first layer,
wherein the first layer has a surface oxygen content from 0.1 to 10% by mole,
wherein the etching liquid comprises an ammonia compound and an oxidizing agent, and has a pH of from 7 to 14, and
wherein the etching method is carried out by a single wafer type etching.

31. The etching method according to claim 30, wherein the transition metal is selected from Co, Ni, Cu, Ag, Ta, Hf, W, Pt and Au.

32. The etching method according to claim 30, wherein the ammonia compound is ammonia or a salt thereof.

33. The etching method according to claim 30, wherein the oxidizing agent is a nitric acid or a hydrogen peroxide.

34. The etching method according to claim 30, wherein an etching rate (R1) of the first layer is 200 Å/min or greater and less than 1000 Å/min.

35. The etching method according to claim 30, wherein the etching liquid further contains at least one surface uniformizing agent selected from the group consisting of a nitrogen-containing organic compound, an aromatic compound and an oxygen-containing organic compound.

36. The etching method according to claim 35, wherein the surface uniformizing agent includes a compound represented by any one of the following formulae (I) to (IX):

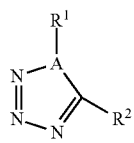
(I)

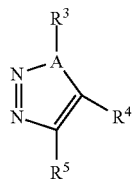
(II)

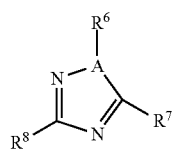
(III)

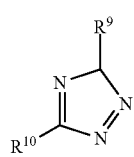
(IV)

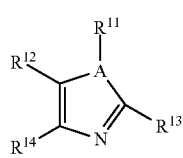
(V)

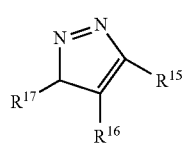
(VI)

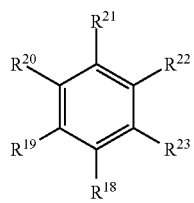
(VII)

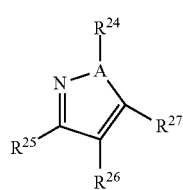
(VIII)

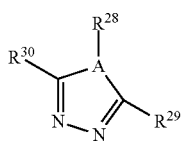
(IX)

wherein, $R^1$ to $R^{30}$ each independently represent a hydrogen atom or a substituent; in this case, neighbors adjacent to each other may be linked or ring-fused to form a cyclic structure; A represents a hetero atom with the proviso that when A is divalent, there exists none of $R^1$, $R^3$, $R^6$, $R^{11}$, $R^{24}$ and $R^{28}$ by which A is each substituted.

37. The etching method according to claim 36, wherein the surface uniformizing agent includes a compound selected from the following groups:

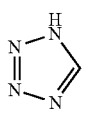
I-1

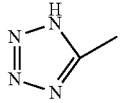
I-2

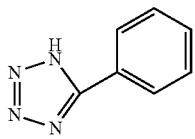
I-3

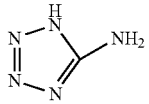
I-4

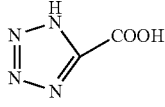
I-5

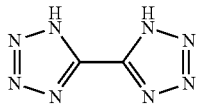
I-6

III-1

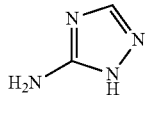
III-2

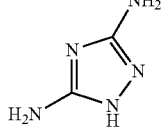
III-3

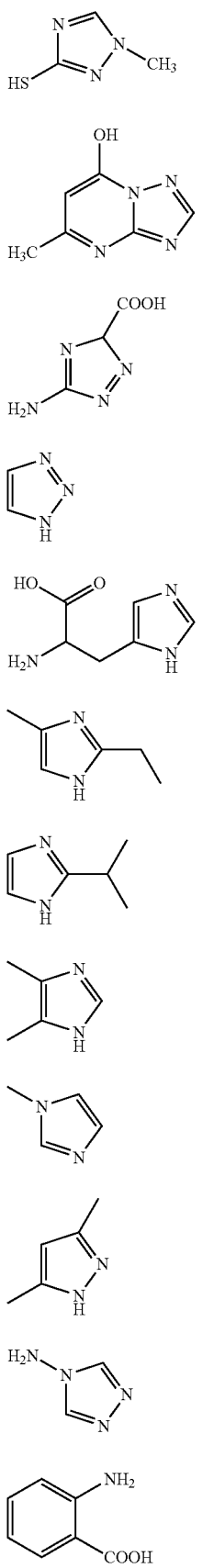
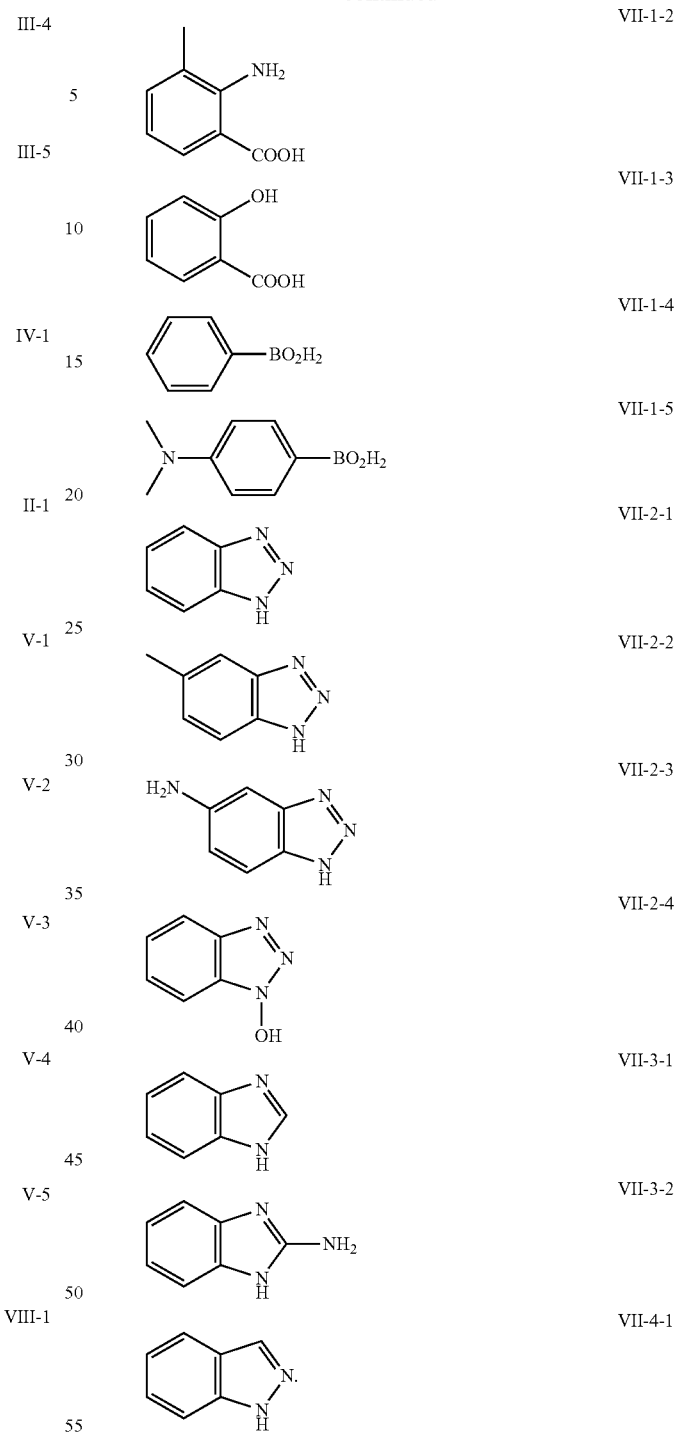

38. The etching method according to claim 35, wherein the surface uniformizing agent is at least one selected from the group consisting of an alcohol compound solvent having 2 to 15 carbon atoms and an ether compound solvent having 2 to 15 carbon atoms.

39. The etching method according to claim 35,
wherein the surface uniformizing agent is contained in a range of from 0.01 to 10% by mass,
wherein the ammonia compound is contained in a range of from 0.1 to 15% by mass, and wherein the oxidizing agent is contained in a range of from 0.5 to 50% by mass.

40. The etching method according to claim 30, comprising the steps:

mixing a first liquid containing the ammonia compound and a second liquid containing the oxidizing agent to prepare the etching liquid; and then on a timely basis, bringing the etching liquid into contact with the substrate thereby processing it.

41. The etching method according to claim 30, wherein a thickness of the first layer is from 0.005 to 0.3 μm, and wherein the width of the second layer is 2 nm or more and less than 1000 nm.

42. A method of producing a semiconductor device comprising: removing a first layer containing titanium nitride (TiN) by the etching method according to claim 30; and then producing the semiconductor device from the remaining substrate.

43. An etching liquid that processes a substrate having a first layer containing titanium nitride (TiN) and a second layer containing a transition metal, and that is applied by selecting the substrate in which a surface oxygen content of the first layer is from 0.1 to 10% by mole, and that is for a single wafer type etching, wherein the etching liquid is an etching liquid having a pH of from 7 to 14, that contains an ammonia compound and an oxidizing agent.

44. The etching liquid according to claim 43, wherein the ammonia compound is contained in a range of from 0.1 to 15% by mass, and wherein the oxidizing agent is contained in a range of from 0.5 to 50% by mass.

45. The etching liquid according to claim 43, further containing at least one surface uniformizing agent selected from the group consisting of a nitrogen-containing organic compound, an aromatic compound and an oxygen-containing organic compound.

46. A kit for preparing an etching liquid, comprising a first liquid containing an ammonia compound and a second liquid containing an oxidizing agent in combination, wherein the kit is composed of the etching liquid having a pH of from 7 to 14, that processes a substrate having a first layer containing titanium nitride (TiN) and a second layer containing a transition metal, and said etching liquid is applied by selecting the substrate in which a surface oxygen content of the first layer is from 0.1 to 10% by mole, and said etching liquid is for a single wafer type etching.

47. The kit for preparing the etching liquid according to claim 46, wherein at least one surface uniformizing agent selected from the group consisting of a nitrogen-containing organic compound, an aromatic compound and an oxygen-containing organic compound is further contained in at least one of the first liquid and the second liquid, or a third liquid other than the first liquid and the second liquid.

* * * * *